(12) United States Patent
Hilton et al.

(10) Patent No.: US 8,530,390 B2
(45) Date of Patent: Sep. 10, 2013

(54) MECHANICAL DECOUPLING IN HIGH-TEMPERATURE SUPERCONDUCTING TAPES

(75) Inventors: David K. Hilton, Tallahassee, FL (US); Matthieu Dalban-Canassy, Tallahassee, FL (US); Hubertus W. Weijers, Crawfordville, FL (US); Ulf P. Trociewitz, Crawfordville, FL (US); David C. Larbalestier, Tallahassee, FL (US)

(73) Assignee: Florida State University Research Foundation, Tallahassee, FL (US)

( * ) Notice: Subject to any disclaimer, the term of this patent is extended or adjusted under 35 U.S.C. 154(b) by 114 days.

(21) Appl. No.: 13/312,454

(22) Filed: Dec. 6, 2011

(65) Prior Publication Data

US 2012/0142539 A1 Jun. 7, 2012

Related U.S. Application Data

(60) Provisional application No. 61/420,429, filed on Dec. 7, 2010.

(51) Int. Cl.
*H01L 39/24* (2006.01)

(52) U.S. Cl.
USPC .......................................................... 505/434

(58) Field of Classification Search
USPC .......................................... 505/434, 430, 500
See application file for complete search history.

(56) References Cited

U.S. PATENT DOCUMENTS

| | | | | |
|---|---|---|---|---|
| 7,168,744 B2 * | 1/2007 | Ashibe et al. | ................. | 285/206 |
| 2009/0197769 A1 * | 8/2009 | Hirose | ........................... | 505/163 |
| 2012/0245033 A1 * | 9/2012 | Lee et al. | ...................... | 505/220 |

* cited by examiner

*Primary Examiner* — Colleen Dunn
(74) *Attorney, Agent, or Firm* — J. Wiley Horton

(57) ABSTRACT

A novel method and structure for creating a high-temperature superconducting tape. The concept of the invention is to use a conductor insulation which not only electrically insulates the conductors of the coil windings from each other, but also mechanically insulates them from the much stronger encapsulant. The insulation material mechanically decouples the conductor from the encapsulant at the boundary between them, thereby preventing damage as a result of thermal and electromagnetic shearing forces. The proposed structure allows the encapsulant to continue performing its functions of preventing coarse motion and stabilizing the coil as a whole, while allowing fine relative displacements of individual coil windings caused by radial stress gradients.

16 Claims, No Drawings

MECHANICAL DECOUPLING IN HIGH-TEMPERATURE SUPERCONDUCTING TAPES

CROSS-REFERENCES TO RELATED APPLICATIONS

This non-provisional patent application claims the benefit—pursuant to 37 C.F.R. §1.53(c)—of a previously filed provisional application. The provisional application was filed on Dec. 7, 2010 and assigned Ser. No. 61/420,429. The provisional application listed the same inventors.

STATEMENT REGARDING FEDERALLY SPONSORED RESEARCH OR DEVELOPMENT

Not Applicable.

MICROFICHE APPENDIX

Not Applicable

BACKGROUND OF THE INVENTION

1. Field of the Invention

This invention relates to the field of conductors. More specifically, the invention comprises a structure and method for insulating high-temperature superconductor tapes that electrically insulates the conductors while mechanically decoupling them from the much-stronger encapsulant.

2. Description of the Related Art

High-temperature superconductor tapes ("HTS tapes") are now used in many applications, including the creation of electromagnetic windings. Such tapes generally include a strong mechanical substrate (such as Hastelloy) bonded to a thin layer of superconductor material. An electrically insulating layer must be added over the assembly. An encapsulant layer must also be provided.

Many types of HTS tapes are known, with one example of a suitable superconducting material being $YBa_2Cu_3O_{7-\delta}$ ("YBCO"). YBCO-based HTS tapes show great potential for the construction of magnets having a very high field strength. Materials presently used in superconducting magnets (such as Nb—Ti and $Nb_3Sn$) cannot operate in fields exceeding about 30 Tesla. In contrast, YBCO HTS tapes retain a superconducting state in magnetic fields well above 100 Tesla.

Construction of superconducting magnets requires not just a suitable conductor, but also a suitable insulation to resist over-voltages during quenching. An encapsulant is also required. This component prevents tape movement, delamination, and resulting damage during encapsulant curing, thermal cycling, and actual operation of the magnet. The magnet is operated at low temperatures using a cryogenic coolant such as liquid nitrogen or liquid helium. The coolant maintains the temperature needed that the conductor remains in a superconducting state.

To date, conductor insulations are wrappings of various adhesive-backed tapes (such as polyimide or polytetrafluoroethylene) and coatings of various polymers (such as varnish, epoxy, and acrylates). If a conductor is created by wrapping one of the insulation materials in a helical manner, gaps are inadvertently introduced. These gaps create variations in the electric field. In addition, the thinnest wrapping materials currently available are far thicker than would be optimum. This is particular true when the wrapping is overlapped to eliminate gaps. The result is a reduction in the coil-winding current density, which increases the size and the cost of the coils.

Insulation with a thickness of about 10 μper tape side is preferred. Polymer coatings of the tape conductors tend to be non-uniform, due primarily to the rectangular cross section and high aspect ratio of the tape (around 40 to 1). The superconducting tape itself has a nominal thickness of only about 100 μm. The edge of the tape is thus quite thin, which causes problems during the application of a coating polymer. The surface tension of such a polymer when in the liquid state is in opposition to the dynamic viscosity. The coating tends to pull away from the tape edges and leave them exposed.

An encapsulant is typically added over the exterior of the HTS tape assembly. Paraffin or epoxy is commonly used. These are electrically insulating and—in principle—they should eliminate the need for a separate insulating material adjacent to the conductors. However, a prohibitively labor-intensive process would be required to electrically isolate the coil windings and layers during encapsulation. Furthermore, paraffin is temperature sensitive, has a high vapor pressure, cracks, and cryoblisters. Although epoxy is an effective encapsulant, it can cause stress-induced damage to the conductor by a strong mechanical coupling to the conductor (either by direct adhesion to the conductor or by adhesion through the various adhesive-backed tapes or polymer coatings).

Detrimental thermal and electromagnetic tensile and shear stresses are introduced at the boundary between the conductors and the encapsulant during both cooling and energization of the magnet. The thermal stresses in a magnet are produced by differential thermal contraction during cooling. The electromagnetic stresses are those produced by the interaction of the self-field of the magnet and its energizing current (the so-called Lorentz stresses).

In a solenoidal coil, a hoop stress develops parallel to the conductor axis in the winding. Additionally, axial compressive stresses develop that tend to expand the coil outward. The existing coated conductor designs are strong in tension along the tape axis. However, they are much weaker when stress is applied in a direction that is perpendicular to the tape axis. It has been observed that the ratio of axial to perpendicular strength in HTS tape may be as high as 100 to 1. This characteristic allows delamination of the superconducting YBCO thin film from its Hastelloy substrate at stresses as low as about 5 MPa. The present invention seeks to mitigate this damaging phenomenon by using a novel structure for the HTS tape.

BRIEF SUMMARY OF THE PRESENT INVENTION

The present invention comprises a novel method and structure for creating a high-temperature superconducting tape. The concept of the invention is to use a conductor insulation which not only electrically insulates the conductors of the coil windings from each other, but also mechanically insulates them from the much stronger encapsulant. The insulation material mechanically decouples the conductor from the encapsulant at the boundary between them, thereby preventing damage as a result of thermal and electromagnetic shearing forces. The proposed structure allows the encapsulant to continue performing its functions of preventing coarse

DETAILED DESCRIPTION OF THE INVENTION

As stated previously, an objective of the present invention is to mechanically decouple the conductor tape from the surrounding encapsulant by providing a suitable insulating material therebetween. There are several different ways to achieve this objective. One approach is to employ a medical-grade, low-temperature-compatible heat-shrink tubing having an extremely thin wall. Such products are provided by Advanced Polymers, Inc. of Salem, N.H.

A preferred tubing consists of an extruded and expanded polyethylene terepthalate, a polyester, with a melting point of about 508 K. This material has an operating range of 77 K-408 K, and a 3.8 μm minimum wall thickness. This material uniformly insulates tape conductors—including the edge of the conductors—and does not crack at low temperatures.

Shrinkage is the mechanism of linking the material to the conductor tape, rather than adhesion. As a result, thermal and electromagnetic tensile and shear stresses are minimized at the boundary between the conductors and the encapsulant. This allows the use of a strong encapsulant (such as epoxy) which would otherwise cause problems.

The use of the heat-shrink material allows fine relative displacements of individual windings caused by radial stress gradients. Coarse motion is still limited by the relatively strong encapsulant. The facilitation of fine displacements is unconventional, as traditionally the conductor insulation and encapsulant are designed to completely immobilize the conductors in order to prevent damage of the conductors during cooling and energization due to thermal and electromagnetic forces. The inventors have determined, however, that completely immobilizing the conductors actually produces stress-induced damage. It is now known that conductor delamination results from stresses developed during the manufacture, cooling, and energization of coils. It is therefore actually important to provide a weak boundary between the conductors and the encapsulant (so long as such a weak boundary does not impair the function of either component).

The current designs of coated tape superconductors tend to have weak bonding between the superconducting thin films and their supporting metallic substrates and surround. High magnetic field superconductors necessarily develop significant stresses, which will often overwhelm this weak bonding. The present inventive approach therefore addresses two issues: (1) the need to develop a suitable low-temperature insulation; and (2) the need to provide a weak boundary between the conductors and the encapsulant in order to prevent the development of tensile or shear stresses that would cause delamination and thus damage to the conductors.

The use of the aforementioned thin-walled heat-shrink tubing is one approach. Other techniques may include a mold release coating applied to the conductors—insulated or not—so that the bond between the conductors and the encapsulant is suitably weakened. A broad variety of techniques are thus claimed by which relatively weak mechanical interfaces may be introduced into the coil windings to prevent delamination of and thus damage to the conductors.

As some specific examples may benefit the reader's understanding, the following description presents selection criteria which may be used in the selection of heat-shrink tubing used as electrical, thermal, or mechanical insulation.

Assume a long, cylindrical object (such as a tape or wire) with a cross-sectional perimeter P, requiring insulation by heat-shrink tubing. The heat-shrink tubing, with a fractional shrinkage of $\lambda_s$, has an inside circumference of $C_B$ before shrinkage, and an inside circumference of $C_A$ after shrinkage. Consequently, the requirement before shrinkage is $P<C_B$, and the requirement after shrinkage is $C_A<P$ (these requirements being the selection criteria in general). From simple geometry one may then easily understand the following definitions:

$$C_B = 2\pi r_B, C_A = 2\pi r_A$$

$$r_A = (1-\lambda_s) r_B$$

$$C_A = 2\pi (1-\lambda_s) r_B$$

$$d_B = 2 r_B$$

As one would naturally infer, $r_B$ is the radius before shrinkage and $r_A$ is the radius after shrinkage. The general selection criteria in terms of the object cross-sectional perimeter, the heat-shrink tubing inside diameter, and the fractional shrinkage may then be stated as:

$$\frac{P}{\pi} < 2r_B, \; 2r_B < \frac{P}{\pi(1-\lambda_S)}$$

$$\frac{P}{\pi} < d_B < \frac{P}{\pi(1-\lambda_S)},$$

where $d_B$ is the inside diameter of the heat-shrink tubing. Without additional requirements, the diameter of the middle of the defined range ($d^*_B$) is the conservative selection. This may be written as:

$$d_B^* = \frac{2-\lambda_S}{1-\lambda_S} \frac{P}{2\pi}$$

If the conductor is simply a wire with a radius of $\alpha$, then the selection criteria may be written as follows:

$$2a < d_B < \frac{2a}{1-\lambda_S},$$

and $$d_B^* = \frac{2-\lambda_S}{1-\lambda_S} a$$

For the case of a tape having a width of w and a thickness of t (P=2(w+t)), the selection criteria are as follows:

$$\frac{2}{\pi}(w+t) < d_B < \frac{2}{\pi}\left(\frac{w+t}{1-\lambda_S}\right),$$

and $$d_B^* = \frac{2-\lambda_S}{1-\lambda_S} \left(\frac{w+t}{\pi}\right)$$

Table 1 presented below summarizes the calculations for using heat-shrink tubing to insulate SCS-4050 HTS tape from Super Power, Inc. of Schenectady, N.Y. The two fractional shrinkages listed in the table as the lower and upper bounds of the shrinkage range are those recommended by Advanced Polymers to achieve the best performance (assuming a recommended shrinkage temperature of about 150 degrees centigrade or about 302 degrees Fahrenheit). Although SCS-4050 HTS tape is nominally 4.0 mm wide, the other width of 4.2 mm and its corresponding calculations are listed as well to account for the copper stabilizer plating. The actual width and thickness, rather than the nominal dimensions of the tape to be insulated, are required for successful heat-shrink tubing selection.

TABLE 1

| $\lambda_S[-]$ | $\frac{2-\lambda_S}{1-\lambda_S}$ | w[mm] | t[mm] | $d_B$*[mm] | $d_B$*["] |
|---|---|---|---|---|---|
| 0.15 | 2.176 | 4.0 | 0.1 | 2.840 | 0.112 |
| 0.20 | 2.250 | 4.0 | 0.1 | 2.936 | 0.116 |
| 0.15 | 2.176 | 4.2 | 0.1 | 2.979 | 0.117 |
| 0.20 | 2.250 | 4.2 | 0.1 | 3.080 | 0.121 |

Table 2 presents data from the Advanced Polymers (off-the-shelf) heat-shrink tubing. Two optimum inside diameters before shrinkage are shown in Table 1 (2.840 mm and 2.979 mm), depending on the width of the HTS tape to be insulated. Two corresponding optimum selections are also shown in Table 2 (113050CST and 120050WST), based on additional tubing wall thickness and color requirements. A wall thickness of 12.7 μm (0.0005") on a tape side is required to give a 25.4 μm (0.001") total insulation thickness in the application of the HTS tape. The examples presented in Table 2 have inside diameters greater than or equal to the optimum inside diameters before shrinkage highlighted in Table 1 (in order to provide conservative selections). The inside diameters of the extracts are checked according to the previously presented equations to confirm that they are within the acceptable range for the inside diameter of heat-shrink tubing.

TABLE 2

| Wall ["] | Wall [μm] | Inside Diameter ["] | Item Number | Color |
|---|---|---|---|---|
| 0.00025 | 6.4 | 0.113 | 113025CST | Clear |
| 0.00050 | 12.7 | 0.113 | 113050CST | Clear |
| 0.00130 | 33.2 | 0.113 | 113130CST | Clear |
| 0.00250 | 6.4 | 0.120 | 120025CST | Clear |
| 0.00050 | 12.7 | 0.120 | 120050CST | Clear |
| 0.00050 | 12.7 | 0.120 | 120050WST | White |
| 0.00100 | 25.4 | 0.120 | 120100BST | Black |
| 0.00100 | 25.4 | 0.120 | 120100CST | Clear |
| 0.00100 | 25.4 | 0.120 | 120100WST | White |
| 0.00200 | 50.8 | 0.120 | 120200CST | Clear |
| 0.0020 | 50.8 | 0.120 | 120200WST | White |

Although the preceding description contains significant detail, it should not be construed as limiting the scope of the invention but rather as providing illustrations of the preferred embodiments of the invention. The inventive structure and process could be carried out in many different ways. Thus, the scope of the invention should be fixed by the claims ultimately presented rather than the examples given.

Having described our invention, we claim:

1. A method for encapsulating a superconductor tape, comprising:
   a. providing a superconductor tape, including a mechanical substrate bonded to a layer of superconductor material, wherein said superconductor tape has an overall thickness t and an overall width w;
   b. providing a heat-shrink tubing having a thin wall, said heat-shrink tubing being made of an insulating material having a fractional shrinkage $\lambda_s$ and a pre-shrinkage diameter of $d_B$;
   c. selecting said pre-shrinkage diameter of said heat-shrink tubing to conform to the expression $$\frac{2}{\pi}(w+t) < d_B < \frac{2}{\pi}\left(\frac{w+t}{1-\lambda_S}\right);$$

d. placing said heat-shrink tubing around said superconductor tape;
   e. heating said heat shrink tubing to shrink said heat-shrink tubing around said superconductor tape; and
   f. applying an encapsulant over said heat shrink tubing.

2. A method for encapsulating a superconductor tape as recited in claim 1, wherein said pre-shrinkage diameter of said heat-shrink tubing is selected to conform to the expression $$d_B = \frac{2-\lambda_S}{1-\lambda_S}\left(\frac{w+t}{\pi}\right).$$

3. A method for encapsulating a superconductor as recited in claim 1, wherein said heat-shrink tubing is an extruded and expanded polyester.

4. A method for encapsulating a superconductor as recited in claim 3, wherein said heat-shrink tubing is polyethylene terepthalate.

5. A method for encapsulating a superconductor as recited in claim 1, wherein said encapsulant is an epoxy.

6. A method for encapsulating a superconductor as recited in claim 2, wherein said encapsulant is an epoxy.

7. A method for encapsulating a superconductor as recited in claim 3, wherein said encapsulant is an epoxy.

8. A method for encapsulating a superconductor as recited in claim 4, wherein said encapsulant is an epoxy.

9. A method for encapsulating a superconductor tape, comprising:
   a. providing a superconductor tape, including a mechanical substrate bonded to a layer of superconductor material, wherein said superconductor tape has an overall thickness t and an overall width w;
   b. providing a shrinkable tubing having a thin wall, said shrinkable tubing being made of an insulating material having a fractional shrinkage $\lambda_s$ and a pre-shrinkage diameter of $d_B$;
   c. selecting said pre-shrinkage diameter of said shrinkable tubing to conform to the expression $$\frac{2}{\pi}(w+t) < d_B < \frac{2}{\pi}\left(\frac{w+t}{1-\lambda_S}\right);$$

d. placing said shrinkable tubing around said superconductor tape;
   e. shrinking said shrinkable tubing around said superconductor tape; and
   f. applying an encapsulant over said shrinkable tubing.

10. A method for encapsulating a superconductor tape as recited in claim 9, wherein said pre-shrinkage diameter of said shrinkable tubing is selected to conform to the expression $$d_B = \frac{2-\lambda_S}{1-\lambda_S}\left(\frac{w+t}{\pi}\right).$$

11. A method for encapsulating a superconductor as recited in claim 9, wherein said shrinkable tubing is an extruded and expanded polyester.

12. A method for encapsulating a superconductor as recited in claim 11, wherein said shrinkable tubing is polyethylene terepthalate.

13. A method for encapsulating a superconductor as recited in claim 9, wherein said encapsulant is an epoxy.

14. A method for encapsulating a superconductor as recited in claim 10, wherein said encapsulant is an epoxy.

15. A method for encapsulating a superconductor as recited in claim 11, wherein said encapsulant is an epoxy.

16. A method for encapsulating a superconductor as recited in claim 12, wherein said encapsulant is an epoxy.

\* \* \* \* \*